(12) United States Patent
Shi (10) Patent No.: US 10,573,241 B2
(45) Date of Patent: Feb. 25, 2020

(54) DRIVING CIRCUIT AND DISPLAY DEVICE (71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductors Display Technology Co., Ltd, Shenzhen, Guangdong (CN)

( * ) Notice: Subject to any disclaimer, the term of this patent is extended or adjusted under 35 U.S.C. 154(b) by 100 days.

(21) Appl. No.: 15/749,219

(22) PCT Filed: Nov. 25, 2017

(86) PCT No.: PCT/CN2017/112974
§ 371 (c)(1),
(2) Date: Jan. 31, 2018

(87) PCT Pub. No.: WO2019/033607
PCT Pub. Date: Feb. 21, 2019

(65) Prior Publication Data
US 2019/0057656 A1    Feb. 21, 2019

(30) Foreign Application Priority Data
Aug. 15, 2017  (CN) .......................... 2017 1 0697988

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3266; G09G 3/3233; G09G 2310/0202; G09G 2320/045; G09G 2320/0295; H01L 27/1251
See application file for complete search history.

(56) References Cited

U.S. PATENT DOCUMENTS

2011/0007067 A1    1/2011  Ryu
2016/0042707 A1*   2/2016  Wang .................. G09G 3/2044
                                                    345/214
(Continued)

FOREIGN PATENT DOCUMENTS

CN        1975847 A    6/2007
CN      102054431 A    5/2011
(Continued)

*Primary Examiner* — Brent D Castiaux
(74) *Attorney, Agent, or Firm* — Andrew C. Cheng (57) ABSTRACT

Disclosed are a driving circuit and a display device, comprising a first scan driving circuit, a second scan driving circuit, a selector and at least one pixel unit; wherein the first scan driving circuit and the second scan driving circuit are respectively coupled to the selector and the selector is coupled to the at least one pixel unit; the selector outputs a first scanning signal of the first scan driving circuit to the at least one pixel unit in a first duration to make the at least one pixel unit in a display state; the selector outputs a second scanning signal of the second scan driving circuit to the at least one pixel unit in a second duration to make the at least one pixel unit in a compensation state; wherein the first duration and the second duration are different.

16 Claims, 4 Drawing Sheets

(51) Int. Cl.
*G09G 3/3266* (2016.01)
*H01L 27/12* (2006.01)
(52) U.S. Cl.
CPC . *H01L 27/1251* (2013.01); *G09G 2310/0202* (2013.01); *G09G 2320/0295* (2013.01); *G09G 2320/045* (2013.01)

(56) References Cited

U.S. PATENT DOCUMENTS

2016/0247446 A1* 8/2016 Cao ................... G09G 3/3225
2017/0256198 A1* 9/2017 Hwang ............... G09G 3/3225

FOREIGN PATENT DOCUMENTS

| | | | |
|---|---|---|---|
| CN | 103886831 A | | 6/2014 |
| CN | 104658472 A | | 5/2015 |
| CN | 105243996 A | * | 1/2016 |
| CN | 105243996 A | | 1/2016 |
| CN | 106128384 A | | 11/2016 |
| CN | 107274832 A | | 10/2017 |
| JP | 2012073498 A | | 4/2012 |
| KR | 20170051629 A | | 5/2017 |

* cited by examiner

DRIVING CIRCUIT AND DISPLAY DEVICE

CROSS REFERENCE

This application claims the priority of Chinese Patent Application No. 201710697988.5, entitled "Driving circuit and display device", filed on Aug. 15, 2017, the disclosure of which is incorporated herein by reference in its entirety.

FIELD OF THE INVENTION

The present invention relates to an electronic field, and more particularly to a driving circuit and a display device.

BACKGROUND OF THE INVENTION

The conventional OLED (Organic Light-Emitting Diode) driving circuit at least composed of 2T1C, i.e., a switching thin film transistor, a driving thin film transistor and a storage capacitor, for realizing the stable display of the OLED. However, due to the long working time of the OLED driving circuit, the driving thin film transistor is subjected to severe voltage stress, which may cause the threshold voltage of the driving thin film transistor to drift, thereby affecting the brightness of the OLED and causing the inconsistent display of respective pixel units of the display panel.

SUMMARY OF THE INVENTION

The embodiment of the present invention provides a driving circuit and a display device, which can ensure the display consistency of the pixel units to improve the display effect of the organic light emitting diode.

First, the embodiment of the present invention provides a driving circuit, comprising a first scan driving circuit, a second scan driving circuit, a selector and at least one pixel unit; wherein the first scan driving circuit and the second scan driving circuit are respectively coupled to the selector and the selector is coupled to the at least one pixel unit;

the selector outputs a first scanning signal of the first scan driving circuit to the at least one pixel unit in a first duration to make the at least one pixel unit in a display state; the selector outputs a second scanning signal of the second scan driving circuit to the at least one pixel unit in a second duration to make the at least one pixel unit in a compensation state; wherein the first duration and the second duration are different.

The selector comprises at least one thin film transistor, a triggering signal end, a high voltage input end and a low voltage input end;

wherein as the selector receives a high voltage direct current signal provided by the high voltage input end and a low voltage direct current signal provided by the low voltage input end and if the selector receives a triggering signal provided by the triggering signal end in the first duration, the selector controls the at least one thin film transistor to select the first scan driving signal of the first scan driving circuit to be outputted to the at least one pixel unit;

wherein as the selector receives the high voltage direct current signal provided by the high voltage input end and the low voltage direct current signal provided by the low voltage input end and if the selector receives the triggering signal inputted by the triggering signal end in the second duration, the selector controls the at least one thin film transistor to select the second scan driving signal of the second scan driving circuit to be outputted to the at least one pixel unit.

The at least thin film transistor comprises:

a first thin film transistor (T1), wherein both a gate and a source of the first thin film transistor are coupled to the high voltage input end and a drain of the first thin film transistor is coupled to a first node;

a second thin film transistor (T2), wherein a gate of the second thin film transistor is coupled to the triggering signal end, a drain of the second thin film transistor is coupled to the first node and a source of the second thin film transistor is coupled to the low voltage input end;

a third thin film transistor (T3), wherein a gate of the third thin film transistor is coupled to the first node, a source of the third thin film transistor is coupled to first scan driving circuit and a drain of the third thin film transistor is coupled to a scanning line;

a fourth thin film transistor (T4), wherein a gate of the fourth thin film transistor is coupled to the triggering signal end, a source of the fourth thin film transistor is coupled to the second scan driving circuit and a drain of the fourth thin film transistor is coupled to the scanning line.

A thin film transistor switching state of the at least one thin film transistor is controlled by the triggering signal; the thin film transistor switching state comprises an off state and an on state.

In the first duration, the triggering signal is in a low voltage level state, the second thin film transistor (T2) and the fourth thin film transistor (T4) are in the off state, the third thin film transistor (T3) is in the on state to select the first scan driving circuit to provide the first scan driving signal;

in the second duration, the triggering signal is in a high voltage level state, the second thin film transistor (T2) and the fourth thin film transistor (T4) are in the on state, the third thin film transistor (T3) is in the off state to select the second scan driving circuit to provide the second scan driving signal.

As the triggering signal is in the low voltage level state, the first node is at a high voltage level; as the triggering signal is in the high voltage level state, the first node is at a low voltage level.

The gate of the third thin film transistor (T3) is coupled to a second node, the source of the third thin film transistor is coupled to the first scan driving circuit and the drain of the third thin film transistor is coupled to the scanning line;

the at least thin film transistor further comprises:

a fifth thin film transistor (T5), wherein a gate of the fifth thin film transistor is coupled to the first node, a source of the fifth thin film transistor is coupled to the high voltage level input end and a drain of the fifth thin film transistor is coupled to the second node;

a sixth thin film transistor (T6), wherein a gate of the sixth thin film transistor is coupled to the triggering signal end, a source of the sixth thin film transistor is coupled to the low voltage level input end and a drain of the sixth thin film transistor is coupled to the second node.

In the first duration, the triggering signal is in a low voltage level state, the second thin film transistor (T2), the fourth thin film transistor (T4) and the sixth thin film transistor (T6) are in the off state, the third thin film transistor (T3) and the fifth thin film transistor (T5) are in the on state to select the first scan driving circuit to provide the first scan driving signal;

in the second duration, the triggering signal is in a high voltage level state, the second thin film transistor (T2), the fourth thin film transistor (T4) and the sixth thin film transistor (T6) are in the on state, the third thin film transistor (T3) and the fifth thin film transistor (T5) are in the off state to select the second scan driving circuit to provide the second scan driving signal.

The at least one pixel unit further comprises:

a seventh thin film transistor (T7), wherein a source of the seventh thin film transistor is coupled to a data line and a gate of the seventh thin film transistor is coupled to the scanning line;

an eighth thin film transistor (T8), wherein a gate of the eighth thin film transistor is coupled to a drain of the seventh thin film transistor (T7), a source of the eighth thin film transistor is coupled to the high voltage level direct current input end, a drain of the eighth thin film transistor is coupled to an anode of an organic light emitting diode of the at least one pixel unit; a cathode of the organic light emitting diode is grounded;

a ninth thin film transistor (T9), wherein a gate of the ninth thin film transistor is coupled to the scanning line, a source of the ninth thin film transistor is coupled to a detecting circuit and a drain of the ninth thin film transistor is coupled to the drain of the eighth thin film transistor (T8);

a coupling capacitor, wherein a first end of the coupling capacitor is coupled to the gate of the eighth thin film transistor (T8) and a second end of the coupling capacitor is coupled to the drain of the eighth thin film transistor (T8).

Second, the embodiment of the present invention further provides a display device, comprising any one of the aforesaid driving circuits.

In conclusion, the driving circuit and the display device of the embodiment of the present invention can provide the scan driving signal for the pixel unit according to the compensation requirement or the driving requirement of the pixel unit. Different scan driving circuits can alternately provide scan driving signals to the pixel units through the selector, which ensures the display quality of the pixel units to certain extent.

BRIEF DESCRIPTION OF THE DRAWINGS

In order to more clearly illustrate the embodiments of the present invention, the following figures will be described in the embodiments are briefly introduced. It is obvious that the drawings are some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the invention, which needs explanation is that the term "installation", "connected", "connection" should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

The driving circuit and the display device of the embodiment of the present invention can provide the scan driving signal for the pixel unit according to the compensation requirement or the driving requirement of the pixel unit. Different scan driving circuits can alternately provide scan driving signals to the pixel units through the selector, which ensures the display quality of the pixel units to certain extent. A drive circuit and a display device according to embodiments of the present invention will be described in detail below with FIG. 1 to FIG. 5.

Figure 1:
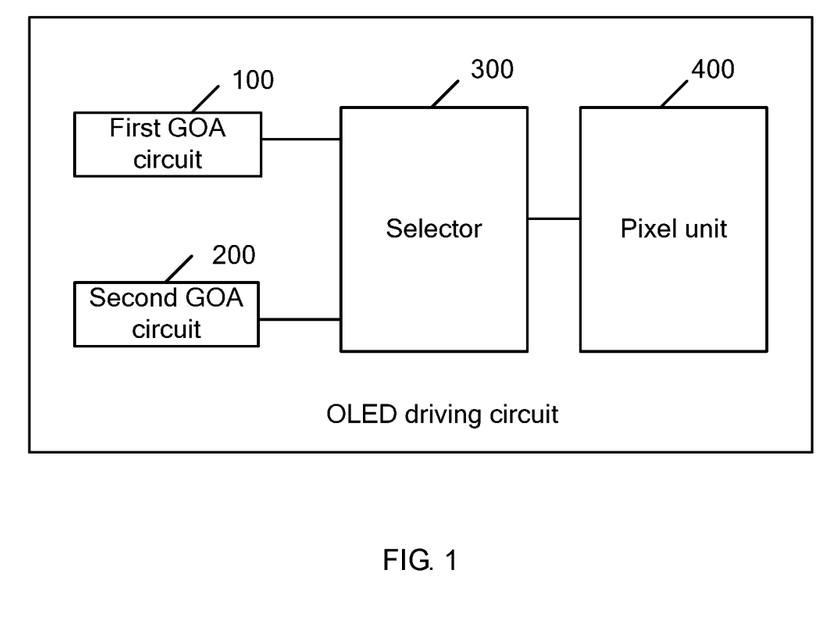
FIG. 1 is a structure diagram of a driving circuit provided by the embodiment of the present invention.

Please refer to FIG. 1. FIG. 1 is a structure diagram of a driving circuit provided by the embodiment of the present invention. The driving circuit shown in figure at least comprises: a first scan driving circuit 100, a second scan driving circuit 200, a selector 300 and at least one pixel unit 400. The first scan driving circuit 100 and the second scan driving circuit 200 are respectively coupled to the selector 300 and the selector 300 is coupled to the at least one pixel unit 400. As shown in FIG. 1, in one embodiment of the present invention, the first scan driving circuit 100 and the second scan driving circuit 200 can be manufactured with the Gate Driver On Array (GOA) technology and can be used to drive the Organic Light-Emitting Diode (OLED) for display.

The first scan driving circuit 100 can provide a first scan driving signal to the at least one pixel unit 400. The second scan driving circuit 200 can provide a second scan driving signal to the at least one pixel unit 400. The first scan driving signal can satisfy the normal driving requirement of the at least one pixel unit 400. The second scan driving signal can satisfy the compensation requirement of the at least one pixel unit 400.

In one embodiment, the selector 300 can select to output a first scanning signal to the at least one pixel unit 400 in a first duration to make the at least one pixel unit 400 in a display state. The selector 300 can select to output a second scanning signal to the at least one pixel unit 400 in a second duration to make the at least one pixel unit in a compensation state.

In one embodiment, the selector 300 can comprise at least one thin film transistor. The selector 300 can realize the selection of the scan driving signals of the scan driving circuits with the cooperation of the at least one thin film transistor. Namely, the first scan driving signal or the second scan driving signal is selected to be outputted to the at least one pixel unit 400.

Figure 2:
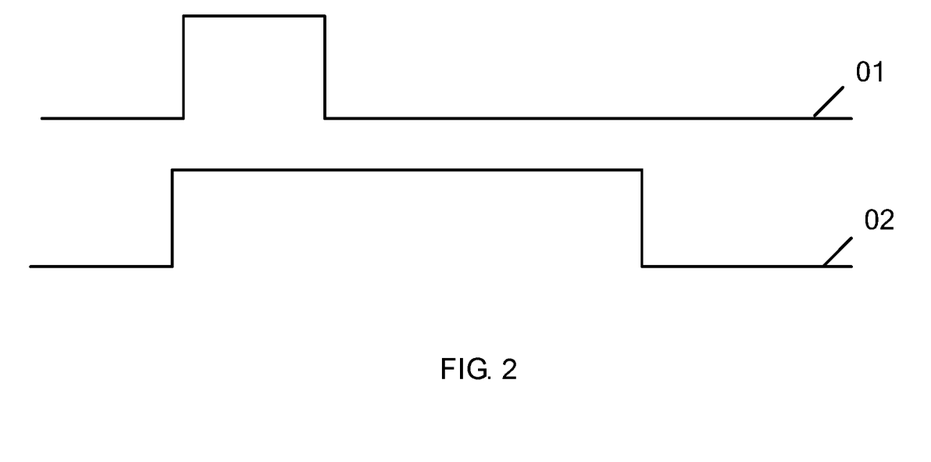
FIG. 2 is a waveform diagram of scan driving signals provided by the embodiment of the present invention.

In one embodiment, the first duration and the second duration can be different. As an illustration, as shown in FIG. 2, 01 is a waveform of the first scan driving signal. 02 is a waveform of the second scan driving signal.

The embodiment of the present invention possesses the property of the externally compensating the scan driving signal for the OLED and can alternately provide scan driving signals to the at least one pixel unit through the selector to provide two waveforms of the scan driving signals required for normal work and the compensation, which ensures the display quality of the pixel units to certain extent.

Figure 3:
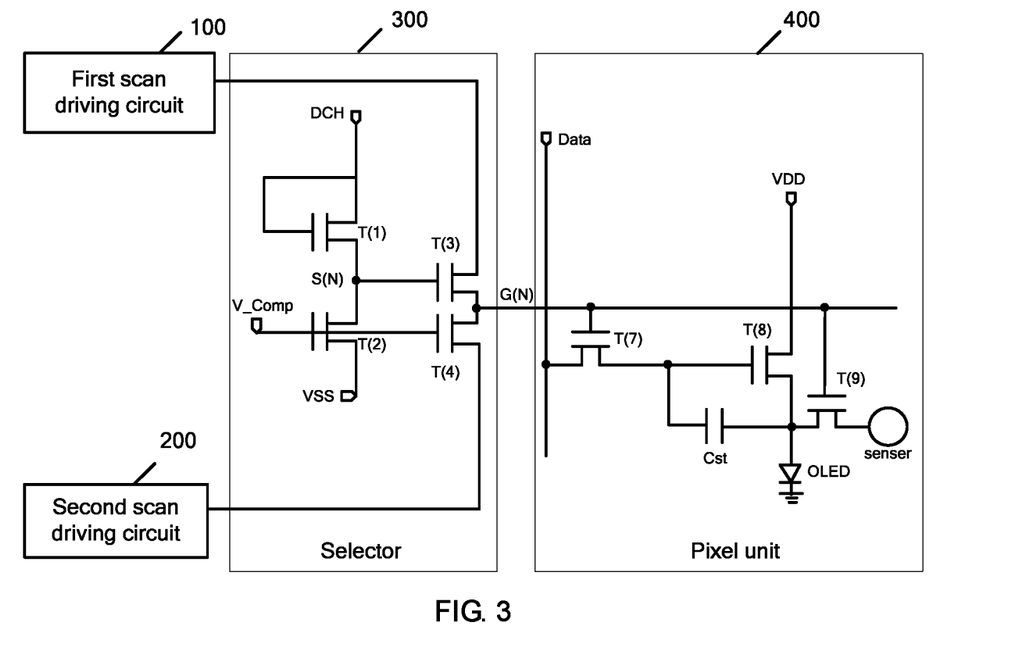
FIG. 3 is a circuit diagram of a driving circuit provided by another embodiment of the present invention.

Please refer to FIG. 3. FIG. 3 is a circuit diagram of a driving circuit provided by the embodiment of the present invention. With combination of FIG. 1, the driving circuit shown in FIG. 3 at least comprises: a first scan driving circuit 100, a second scan driving circuit 200, a selector 300 and at least one pixel unit 400. The first scan driving circuit 100 and the second scan driving circuit 200 are respectively coupled to the selector 300 and the selector 300 is coupled to the pixel unit 400.

The selector 300 can comprise at least one thin film transistor, a triggering signal end V-Comp, a high voltage level input end DCH and a low voltage level input end VSS. As shown in FIG. 3, the selector 300 can comprise a first thin film transistor T1, a second thin film transistor T2, a third thin film transistor T3 and a fourth thin film transistor T4.

The selector 300 can receive a triggering signal provided by the triggering signal end V-Comp. The triggering signal is at a low voltage level in the first duration and at a high voltage level in the second duration.

The selector 300 receives a high voltage direct current signal provided by the high voltage input end DCH, a low voltage direct current signal provided by the low voltage input end VSS and a triggering signal provided by the triggering signal end V_Comp to control the cooperation of the respective thin film transistors in the selector 300 to accomplish the selecting process for the scan driving signals provided by the different scan driving circuits.

In one embodiment, the high voltage direct current signal provided by the high voltage input end DCH can be constantly in the high voltage level state and the low voltage direct current signal provided by the low voltage input end VSS can be constantly in the low voltage level state in various durations. The triggering signal alternates between the high voltage level state and the low voltage level state depending on the setting.

In one embodiment, if the selector 300 receives the triggering signal in the first duration, the selector can control the at least one thin film transistor to select the first scan driving signal of the first scan driving circuit 100. The triggering signal received by the selector 300 in the first duration is in a low voltage level state. If the selector 300 receives the triggering signal in the second duration, the selector can control the at least one thin film transistor to select the second scan driving signal of the second scan driving circuit 200. The triggering signal received by the selector 300 in the second duration is in a high voltage level state.

In the embodiment of the present invention, as shown in FIG. 3, the at least one thin film transistor in the selector 300 can comprise: a first thin film transistor T1, wherein both a gate and a source of the first thin film transistor are coupled to the high voltage input end DCH and a drain of the first thin film transistor is coupled to a first node S(N); a second thin film transistor T2, wherein a gate of the second thin film transistor is coupled to the triggering signal end V_Comp, a drain of the second thin film transistor is coupled to the first node S(N) and a source of the second thin film transistor is coupled to the low voltage input end VSS; a third thin film transistor T3, wherein a gate of the third thin film transistor is coupled to the first node S(N), a source of the third thin film transistor is coupled to first scan driving circuit 100 and a drain of the third thin film transistor is coupled to a scanning line G(N); a fourth thin film transistor T4, wherein a gate of the fourth thin film transistor is coupled to the triggering signal end V_Comp, a source of the fourth thin film transistor is coupled to the second scan driving circuit 200 and a drain of the fourth thin film transistor is coupled to the scanning line G(N). In one embodiment, the gates of the respective thin film transistors can be used to control the switching states of the thin film transistors (off state or on state) according to the received signals.

In one embodiment, in the first duration, the triggering signal is in a low voltage level state, the second thin film transistor T2 and the fourth thin film transistor T4 are in the off state, the third thin film transistor T3 is in the on state to select the first scan driving circuit 100 to provide the first scan driving signal; in the second duration, the triggering signal is in a high voltage level state, the second thin film transistor T2 and the fourth thin film transistor T4 are in the on state, the third thin film transistor T3 is in the off state to select the second scan driving circuit 200 to provide the second scan driving signal. As the triggering signal is in the low voltage level state, the first thin film transistor T1 is on, the second thin film transistor T2 is off and the first node S(N) is at a high voltage level such that the third thin film transistor T3 is on. As the triggering signal is in the high voltage level state, the first thin film transistor T1 is on, such that the low voltage level direct current signal of the low voltage input end VSS is inputted and then, the first node S(N) is at low voltage level and the third thin film transistor T3 is off.

Figure 4:
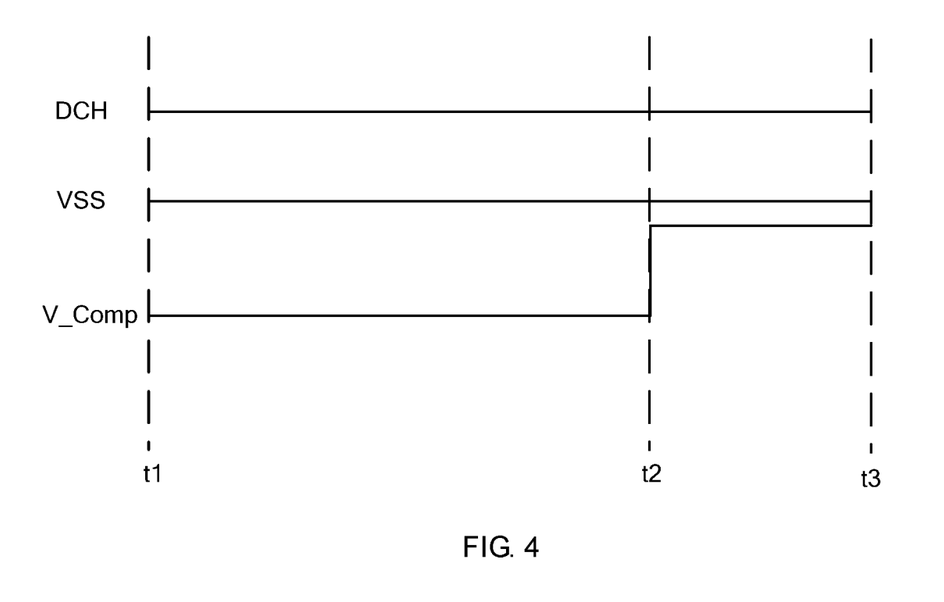
FIG. 4 is a waveform diagram of a high voltage direct current signal, a low voltage direct current signal and a triggering signal provided by the embodiment of the present invention.

For instance, as shown in FIG. 4, which includes a waveform of a triggering signal provided by the triggering signal end V_Comp, a waveform of a high voltage direct current signal provided by the high voltage level input end DCH and a waveform of a low voltage direct current signal provided by the low voltage level input end VSS. In the first duration (t1-t2), the voltage of the triggering signal provided by the triggering signal end V_Comp is −8V, the voltage of the high voltage direct current signal provided by the high voltage level input end DCH is 27V and the voltage of the low voltage direct current signal provided by the low voltage level input end VSS is −8V. The high voltage direct current signal of 27V, the triggering signal of −8V and the low voltage direct current signal of −8V can enable the second thin film transistor T2 and the fourth thin film transistor T4 to be off and enable the third thin film transistor T3 to be on. Then, the selector 300 can select the first scan driving signal provided by the first scan driving circuit 100 to be outputted to the at least one pixel unit 400. As reaching the time point t2, voltage level of the trigger signal will change from the low voltage level to the high voltage level.

For instance, as shown in FIG. 4, which includes a waveform of a triggering signal provided by the triggering signal end V_Comp, a waveform of a high voltage direct current signal provided by the high voltage level input end DCH and a waveform of a low voltage direct current signal provided by the low voltage level input end VSS. In the second duration (t2-t3), the voltage of the triggering signal provided by the triggering signal end V_Comp is 27V, the voltage of the high voltage direct current signal provided by the high voltage level input end DCH is 27V and the voltage of the low voltage direct current signal provided by the low voltage level input end VSS is −8V. The high voltage direct current signal of 27V, the triggering signal of 27V and the low voltage direct current signal of −8V can enable the second thin film transistor T2 and the fourth thin film transistor T4 to be on and enable the third thin film transistor T3 to be off. Then, the selector 300 can select the second scan driving signal provided by the second scan driving circuit 200 to be outputted to the at least one pixel unit 400.

In one embodiment, the at least one pixel unit 400 can comprise: a seventh thin film transistor T7, an eighth thin film transistor T8, a ninth thin film transistor T9, a coupling capacitor Cst and an organic light emitting diode OLED.

A seventh thin film transistor T7, wherein a source of the seventh thin film transistor is coupled to a data line and a gate of the seventh thin film transistor is coupled to the scanning line G(N); an eighth thin film transistor T8, wherein a gate of the eighth thin film transistor is coupled to a drain of the seventh thin film transistor T7, a source of the eighth thin film transistor is coupled to the high voltage level direct current input end VDD, a drain of the eighth thin film transistor is coupled to an anode of an organic light emitting diode OLED of the pixel unit; a cathode of the organic light emitting diode is grounded; a ninth thin film transistor T9, wherein a gate of the ninth thin film transistor is coupled to the scanning line G(N), a source of the ninth thin film transistor is coupled to a detecting circuit Senser and a drain of the ninth thin film transistor is coupled to the drain of the eighth thin film transistor T8; a coupling capacitor Cst, wherein a first end of the coupling capacitor is coupled to the gate of the eighth thin film transistor T8 and a second end of the coupling capacitor is coupled to the drain of the eighth thin film transistor T8. The data line provides a data signal for controlling the display of the OLED. The detecting circuit Senser can realize the detection of circuit parameters such as the voltage and the current. The coupling capacitor Cst can realize the charging and discharging to the eighth thin film transistor T8 according to the received scan driving signal.

The at least one pixel unit 400 can receive the first scan driving signal or the second scan driving signal of the selector 300 through the scanning line G(N). After the at least one pixel unit 400 receives the first scan driving signal, the cooperation of the respective thin film transistors in the at least one pixel unit 400 is performed to drive the OLED to normally work. After the at least one pixel unit 400 receives the second scan driving signal, the cooperation of the respective thin film transistors in the at least one pixel unit 400 is performed to compensate the OLED.

In the embodiment of the present invention, with the cooperation of the respective thin film transistors of the selector 300, the first scan driving signal of the first scan driving circuit 100 is selected to be outputted to the at least one pixel unit 400 in the first duration to ensure the normal work of the at least one pixel unit 400; or the second scan driving signal of the second scan driving circuit 200 is selected to be outputted to the at least one pixel unit 400 in the second duration to ensure the compensation to the at least one pixel unit 400. By selecting the scan driving signals of different scan driving circuits to be outputted to the at least one pixel unit 400 in different durations, the display consistency of the pixel units can be ensured to improve the display effect of the organic light emitting diode.

Figure 5:
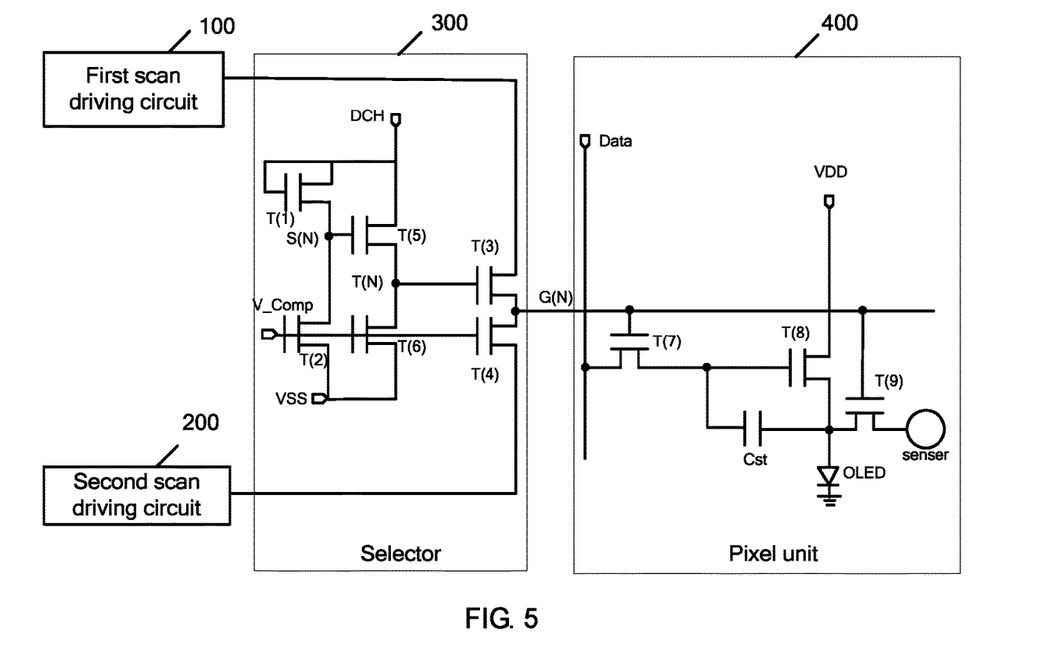
FIG. 5 is a circuit diagram of a driving circuit provided by one another embodiment of the present invention.

Please refer to FIG. 5, which is a circuit diagram of a driving circuit provided by one another embodiment of the present invention. With combination of FIG. 3, the driving circuit shown in FIG. 5 at least comprises: a first scan driving circuit 100, a second scan driving circuit 200, a selector 300 and at least one pixel unit 400. The first scan driving circuit 100 and the second scan driving circuit 200 are respectively coupled to the selector 300 and the selector 300 is coupled to the pixel unit 400.

The selector 300 can comprise at least one thin film transistor. As shown in FIG. 5, the selector 300 can comprise a first thin film transistor T1, a second thin film transistor T2, a third thin film transistor T3, a fourth thin film transistor T4, a fifth thin film transistor T5, a sixth thin film transistor T6, a triggering signal end V-Comp, a high voltage level input end DCH and a low voltage level input end VSS.

The selector 300 can receive a triggering signal provided by the triggering signal end V-Comp. The triggering signal is in a low voltage level state in the first duration and in a high voltage level state in the second duration.

The selector 300 receives a high voltage direct current signal provided by the high voltage input end DCH, a low voltage direct current signal provided by the low voltage input end VSS and a triggering signal provided by the triggering signal end V_Comp to control the cooperation of the respective thin film transistors in the selector 300 to accomplish the selecting process for the scan driving signals provided by the different scan driving circuits.

In one embodiment, the high voltage direct current signal can be constantly in the high voltage level state and the low voltage direct current signal can be constantly in the low voltage level state in various durations. The triggering signal alternates between the high voltage level state and the low voltage level state depending on the setting.

In one embodiment, if the selector 300 receives the triggering signal in the first duration, the selector can control the at least one thin film transistor to select the first scan driving signal of the first scan driving circuit 100. The triggering signal received by the selector 300 in the first duration is in a low voltage level state. If the selector 300 receives the triggering signal in the second duration, the selector can control the at least one thin film transistor to select the second scan driving signal of the second scan driving circuit 200. The triggering signal received by the selector 300 in the second duration is in a high voltage level state.

In the embodiment of the present invention, the at least one thin film transistor in the selector 300 can comprise: a first thin film transistor T1, wherein both a gate and a source of the first thin film transistor are coupled to the high voltage input end DCH and a drain of the first thin film transistor is coupled to a first node S(N); a second thin film transistor T2, wherein a gate of the second thin film transistor is coupled to the triggering signal end V_Comp, a drain of the second thin film transistor is coupled to the first node S(N) and a source of the second thin film transistor is coupled to the low voltage input end VSS; a third thin film transistor T3, wherein a gate of the third thin film transistor is coupled to a second node T(N), a source of the third thin film transistor is coupled to first scan driving circuit 100 and a drain of the third thin film transistor is coupled to a scanning line G(N); a fourth thin film transistor T4, wherein a gate of the fourth thin film transistor is coupled to the triggering signal end V_Comp, a source of the fourth thin film transistor is coupled to the second scan driving circuit 200 and a drain of the fourth thin film transistor is coupled to the scanning line G(N); a fifth thin film transistor T5, wherein a gate of the fifth thin film transistor is coupled to the first node S(N), a source of the fifth thin film transistor is coupled to the high voltage level input end DCH and a drain of the fifth thin film transistor is coupled to the second node T(N); a sixth thin film transistor T6, wherein a gate of the sixth thin film transistor is coupled to the triggering signal end V_Comp, a source of the sixth thin film transistor is coupled to the low voltage level input end VSS and a drain of the sixth thin film transistor is coupled to the second node T(N).

In one embodiment, the gates of the respective thin film transistors can be used to control the switching states of the thin film transistors (off state or on state) according to the received signals.

In one embodiment, the amount of the thin film transistors in the selector 300 can be arranged according to the practical requirement and the amount of the scan driving circuits to select the scan driving signal of the scan driving circuit, which is required to be outputted. Meanwhile, the time dimension can be increased to output the scan driving signal of the corresponding scan driving circuit to control the display of the at least one pixel unit 400 in various durations.

In one embodiment, in the first duration, the triggering signal is in a low voltage level state, the second thin film transistor T2, the fourth thin film transistor T4 and the sixth thin film transistor T6 are in the off state, the third thin film transistor T3 and the fifth thin film transistor T5 are in the on state to select the first scan driving circuit 100 to provide the first scan driving signal. As the triggering signal is in the low voltage level state, the first thin film transistor T1 is on, the second thin film transistor T2 is off and the first node S(N) is at a high voltage level such that the fifth thin film transistor T5 is on. Since the fifth thin film transistor T5 is on and the sixth thin film transistor T6 is off such that the second node T(N) is at a high voltage level. Then, the third thin film transistor T3 is on to realize the selection of the scan driving signal provided by the first scan driving circuit 100.

For instance, as shown in FIG. 4, which includes a waveform of a triggering signal provided by the triggering signal end V_Comp, a waveform of a high voltage direct current signal provided by the high voltage level input end DCH and a waveform of a low voltage direct current signal provided by the low voltage level input end VSS. In the first duration (t1-t2), the voltage of the triggering signal provided by the triggering signal end V_Comp is −8V, the voltage of the high voltage direct current signal provided by the high voltage level input end DCH is 27V and the voltage of the low voltage direct current signal provided by the low voltage level input end VSS is −8V. The high voltage direct current signal of 27V, the triggering signal of −8V and the low voltage direct current signal of −8V can enable the second thin film transistor T2, the fourth thin film transistor T4 and the sixth thin film transistor T6 to be off and enable the third thin film transistor T3 and the fifth thin film transistor T5 to be on. Then, the selector 300 can select the first scan driving signal provided by the first scan driving circuit 100 to be outputted to the at least one pixel unit 400. As reaching the time point t2, voltage level of the trigger signal will change from the low voltage level to the high voltage level.

In one embodiment, in the second duration, the triggering signal is in a high voltage level state, the second thin film transistor T2, the fourth thin film transistor T4 and the sixth thin film transistor T6 are in the on state, the third thin film transistor T3 and the fifth thin film transistor T5 are in the off state to select the second scan driving circuit 200 to provide the second scan driving signal. As the triggering signal is in the high voltage level state, the second thin film transistor T2 is on, the fourth thin film transistor T4 is on and the sixth thin film transistor T6 is on. After the second thin film transistor T2 is on, the low voltage direct current signal is inputted such that the first node S(N) is at a low voltage level. Since the first node S(N) is at the low voltage level, the fifth thin film transistor T5 is off. After the sixth thin film transistor T6 is on, the low voltage level direct current input end VSS inputs the low voltage level direct current signal such that the second node T(N) is at the low voltage level and the third thin film transistor T3 is off.

For instance, as shown in FIG. 4, which includes a waveform of a triggering signal provided by the triggering signal end V_Comp, a waveform of a high voltage direct current signal provided by the high voltage level input end DCH and a waveform of a low voltage direct current signal provided by the low voltage level input end VSS. In the second duration (t2-t3), the voltage of the triggering signal provided by the triggering signal end V_Comp is 27V, the voltage of the high voltage direct current signal provided by the high voltage level input end DCH is 27V and the voltage of the low voltage direct current signal provided by the low voltage level input end VSS is −8V. The high voltage direct current signal of 27V, the triggering signal of 27V and the low voltage direct current signal of −8V can enable the second thin film transistor T2, the fourth thin film transistor T4 and the sixth thin film transistor T6 to be on and enable the third thin film transistor T3 and the fifth thin film transistor T5 to be off. Then, the selector 300 can select the second scan driving signal provided by the second scan driving circuit 200 to be outputted to the at least one pixel unit 400.

In one embodiment, the at least one pixel unit 400 can comprise: a seventh thin film transistor T7, an eighth thin film transistor T8, a ninth thin film transistor T9, a coupling capacitor Cst and an organic light emitting diode OLED.

A seventh thin film transistor T7, wherein a source of the seventh thin film transistor is coupled to a data line and a gate of the seventh thin film transistor is coupled to the scanning line G(N); an eighth thin film transistor T8, wherein a gate of the eighth thin film transistor is coupled to a drain of the seventh thin film transistor T7, a source of the eighth thin film transistor is coupled to the high voltage level direct current input end VDD, a drain of the eighth thin film transistor is coupled to an anode of an organic light emitting diode OLED of the pixel unit; a cathode of the organic light emitting diode is grounded; a ninth thin film transistor T9, wherein a gate of the ninth thin film transistor is coupled to the scanning line G(N), a source of the ninth thin film transistor is coupled to a detecting circuit Senser and a drain of the ninth thin film transistor is coupled to the drain of the eighth thin film transistor T8; a coupling capacitor Cst, wherein a first end of the coupling capacitor is coupled to the gate of the eighth thin film transistor T8 and a second end of the coupling capacitor is coupled to the drain of the eighth thin film transistor T8. The data line provides a data signal for controlling the display of the OLED.

The at least one pixel unit 400 can receive the first scan driving signal or the second scan driving signal of the selector 300 through the scanning line G(N). After the at least one pixel unit 400 receives the first scan driving signal, the cooperation of the respective thin film transistors is performed to drive the OLED to normally work. After the at least one pixel unit 400 receives the second scan driving signal, the cooperation of the respective thin film transistors is performed to compensate the OLED. The detecting circuit Senser can be used for the detection of circuit parameters such as the voltage and the current.

In the embodiment of the present invention, with the cooperation of the respective thin film transistors of the selector 300, the first scan driving signal of the first scan driving circuit 100 is selected to be outputted to the at least one pixel unit 400 in the first duration to ensure the normal work of the at least one pixel unit 400; or the second scan driving signal of the second scan driving circuit 200 is selected to be outputted to the at least one pixel unit 400 in the second duration to ensure the compensation to the at least one pixel unit 400. By selecting the scan driving signals of different scan driving circuits to be outputted to the at least one pixel unit 400 in different durations, the display consistency of the respective pixel units can be ensured to improve the display effect of the organic light emitting diode.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

The detail description has been introduced above for the driving circuit and the display device having the driving circuit provided by the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:

1. A driving circuit, comprising a first scan driving circuit, a second scan driving circuit, a selector and at least one pixel unit; wherein the first scan driving circuit and the second scan driving circuit are respectively coupled to the selector and the selector is coupled to the at least one pixel unit; the selector outputs a first scanning signal of the first scan driving circuit to the at least one pixel unit in a first duration to make the at least one pixel unit in a display state; the selector outputs a second scanning signal of the second scan driving circuit to the at least one pixel unit in a second duration to make the at least one pixel unit in a compensation state; wherein the first duration and the second duration are different, wherein the selector comprises at least one thin film transistor, a triggering signal end, a high voltage input end and a low voltage input end;

wherein as the selector receives a high voltage direct current signal provided by the high voltage input end and a low voltage direct current signal provided by the low voltage input end and if the selector receives a triggering signal provided by the triggering signal end in the first duration, the selector controls the at least one thin film transistor to select the first scan driving signal of the first scan driving circuit to be outputted to the at least one pixel unit;

wherein as the selector receives the high voltage direct current signal provided by the high voltage input end and the low voltage direct current signal provided by the low voltage input end and if the selector receives the triggering signal inputted by the triggering signal end in the second duration, the selector controls the at least one thin film transistor to select the second scan driving signal of the second scan driving circuit to be outputted to the at least one pixel unit; and wherein the at least one thin film transistor comprises:

a first thin film transistor (T1), wherein both a gate and a source of the first thin film transistor are coupled to the high voltage input end and a drain of the first thin film transistor is coupled to a first node;

a second thin film transistor (T2), wherein a gate of the second thin film transistor is coupled to the triggering signal end, a drain of the second thin film transistor is coupled to the first node and a source of the second thin film transistor is coupled to the low voltage input end;

a third thin film transistor (T3), wherein a gate of the third thin film transistor is coupled to the first node, a source of the third thin film transistor is coupled to first scan driving circuit and a drain of the third thin film transistor is coupled to a scanning line;

a fourth thin film transistor (T4), wherein a gate of the fourth thin film transistor is coupled to the triggering signal end, a source of the fourth thin film transistor is coupled to the second scan driving circuit and a drain of the fourth thin film transistor is coupled to the scanning line.

2. The driving circuit according to claim 1, wherein a thin film transistor switching state of the at least one thin film transistor is controlled by the triggering signal; the thin film transistor switching state comprises an off state and an on state.

3. The driving circuit according to claim 2, wherein in the first duration, the triggering signal is in a low voltage level state, the second thin film transistor (T2) and the fourth thin film transistor (T4) are in the off state, the third thin film transistor (T3) is in the on state to select the first scan driving circuit to provide the first scan driving signal;

in the second duration, the triggering signal is in a high voltage level state, the second thin film transistor (T2) and the fourth thin film transistor (T4) are in the on state, the third thin film transistor (T3) is in the off state to select the second scan driving circuit to provide the second scan driving signal.

4. The driving circuit according to claim 3, wherein as the triggering signal is in the low voltage level state, the first node is at a high voltage level; as the triggering signal is in the high voltage level state, the first node is at a low voltage level.

5. The driving circuit according to claim 1, wherein the gate of the third thin film transistor (T3) is coupled to a second node, the source of the third thin film transistor is coupled to the first scan driving circuit and the drain of the third thin film transistor is coupled to the scanning line;
the at least thin film transistor further comprises:
a fifth thin film transistor (T5), wherein a gate of the fifth thin film transistor is coupled to the first node, a source of the fifth thin film transistor is coupled to the high voltage level input end and a drain of the fifth thin film transistor is coupled to the second node;
a sixth thin film transistor (T6), wherein a gate of the sixth thin film transistor is coupled to the triggering signal end, a source of the sixth thin film transistor is coupled to the low voltage level input end and a drain of the sixth thin film transistor is coupled to the second node.

6. The driving circuit according to claim 5, wherein in the first duration, the triggering signal is in a low voltage level state, the second thin film transistor (T2), the fourth thin film transistor (T4) and the sixth thin film transistor (T6) are in the off state, the third thin film transistor (T3) and the fifth thin film transistor (T5) are in the on state to select the first scan driving circuit to provide the first scan driving signal;
in the second duration, the triggering signal is in a high voltage level state, the second thin film transistor (T2), the fourth thin film transistor (T4) and the sixth thin film transistor (T6) are in the on state, the third thin film transistor (T3) and the fifth thin film transistor (T5) are in the off state to select the second scan driving circuit to provide the second scan driving signal.

7. The driving circuit according to claim 1, wherein the at least one pixel unit comprises:
a seventh thin film transistor (T7), wherein a source of the seventh thin film transistor is coupled to a data line and a gate of the seventh thin film transistor is coupled to the scanning line;
an eighth thin film transistor (T8), wherein a gate of the eighth thin film transistor is coupled to a drain of the seventh thin film transistor (T7), a source of the eighth thin film transistor is coupled to the high voltage level direct current input end, a drain of the eighth thin film transistor is coupled to an anode of an organic light emitting diode of the at least one pixel unit; a cathode of the organic light emitting diode is grounded;
a ninth thin film transistor (T9), wherein a gate of the ninth thin film transistor is coupled to the scanning line, a source of the ninth thin film transistor is coupled to a detecting circuit and a drain of the ninth thin film transistor is coupled to the drain of the eighth thin film transistor (T8);
a coupling capacitor, wherein a first end of the coupling capacitor is coupled to the gate of the eighth thin film transistor (T8) and a second end of the coupling capacitor is coupled to the drain of the eighth thin film transistor (T8).

8. The driving circuit according to claim 2, wherein the at least one pixel unit comprises:
a seventh thin film transistor (T7), wherein a source of the seventh thin film transistor is coupled to a data line and a gate of the seventh thin film transistor is coupled to the scanning line;
an eighth thin film transistor (T8), wherein a gate of the eighth thin film transistor is coupled to a drain of the seventh thin film transistor (T7), a source of the eighth thin film transistor is coupled to the high voltage level direct current input end, a drain of the eighth thin film transistor is coupled to an anode of an organic light emitting diode of the at least one pixel unit; a cathode of the organic light emitting diode is grounded;
a ninth thin film transistor (T9), wherein a gate of the ninth thin film transistor is coupled to the scanning line, a source of the ninth thin film transistor is coupled to a detecting circuit and a drain of the ninth thin film transistor is coupled to the drain of the eighth thin film transistor (T8);
a coupling capacitor, wherein a first end of the coupling capacitor is coupled to the gate of the eighth thin film transistor (T8) and a second end of the coupling capacitor is coupled to the drain of the eighth thin film transistor (T8).

9. A display device, comprising a driving circuit, wherein the driving circuit comprises a first scan driving circuit, a second scan driving circuit, a selector and at least one pixel unit; wherein the first scan driving circuit and the second scan driving circuit are respectively coupled to the selector and the selector is coupled to the at least one pixel unit; the selector outputs a first scanning signal of the first scan driving circuit to the at least one pixel unit in a first duration to make the at least one pixel unit in a display state; the selector outputs a second scanning signal of the second scan driving circuit to the at least one pixel unit in a second duration to make the at least one pixel unit in a compensation state; wherein the first duration and the second duration are different;
wherein the selector comprises at least one thin film transistor, a triggering signal end, a high voltage input end and a low voltage input end;
wherein as the selector receives a high voltage direct current signal provided by the high voltage input end and a low voltage direct current signal provided by the low voltage input end and if the selector receives a triggering signal provided by the triggering signal end in the first duration, the selector controls the at least one thin film transistor to select the first scan driving signal of the first scan driving circuit to be outputted to the at least one pixel unit;
wherein as the selector receives the high voltage direct current signal provided by the high voltage input end and the low voltage direct current signal provided by the low voltage input end and if the selector receives the triggering signal inputted by the triggering signal end in the second duration, the selector controls the at least one thin film transistor to select the second scan driving signal of the second scan driving circuit to be outputted to the at least one pixel unit; and
wherein the at least one thin film transistor comprises:
a first thin film transistor (T1), wherein both a gate and a source of the first thin film transistor are coupled to the high voltage input end and a drain of the first thin film transistor is coupled to a first node;
a second thin film transistor (T2), wherein a gate of the second thin film transistor is coupled to the triggering signal end, a drain of the second thin film transistor is coupled to the first node and a source of the second thin film transistor is coupled to the low voltage input end;
a third thin film transistor (T3), wherein a gate of the third thin film transistor is coupled to the first node, a source of the third thin film transistor is coupled to first scan driving circuit and a drain of the third thin film transistor is coupled to a scanning line;
a fourth thin film transistor (T4), wherein a gate of the fourth thin film transistor is coupled to the triggering signal end, a source of the fourth thin film transistor is coupled to the second scan driving circuit and a drain of the fourth thin film transistor is coupled to the scanning line.

10. The display device according to claim 9, wherein a thin film transistor switching state of the at least one thin film transistor is controlled by the triggering signal; the thin film transistor switching state comprises an off state and an on state.

11. The display device according to claim 10, wherein in the first duration, the triggering signal is in a low voltage level state, the second thin film transistor (T2) and the fourth thin film transistor (T4) are in the off state, the third thin film transistor (T3) is in the on state to select the first scan driving circuit to provide the first scan driving signal;

in the second duration, the triggering signal is in a high voltage level state, the second thin film transistor (T2) and the fourth thin film transistor (T4) are in the on state, the third thin film transistor (T3) is in the off state to select the second scan driving circuit to provide the second scan driving signal.

12. The display device according to claim 11, wherein as the triggering signal is in the low voltage level state, the first node is at a high voltage level; as the triggering signal is in the high voltage level state, the first node is at a low voltage level.

13. The display device according to claim 9, wherein the gate of the third thin film transistor (T3) is coupled to a second node, the source of the third thin film transistor is coupled to the first scan driving circuit and the drain of the third thin film transistor is coupled to the scanning line;

the at least thin film transistor further comprises:

a fifth thin film transistor (T5), wherein a gate of the fifth thin film transistor is coupled to the first node, a source of the fifth thin film transistor is coupled to the high voltage level input end and a drain of the fifth thin film transistor is coupled to the second node;

a sixth thin film transistor (T6), wherein a gate of the sixth thin film transistor is coupled to the triggering signal end, a source of the sixth thin film transistor is coupled to the low voltage level input end and a drain of the sixth thin film transistor is coupled to the second node.

14. The display device according to claim 13, wherein in the first duration, the triggering signal is in a low voltage level state, the second thin film transistor (T2), the fourth thin film transistor (T4) and the sixth thin film transistor (T6) are in the off state, the third thin film transistor (T3) and the fifth thin film transistor (T5) are in the on state to select the first scan driving circuit to provide the first scan driving signal;

in the second duration, the triggering signal is in a high voltage level state, the second thin film transistor (T2), the fourth thin film transistor (T4) and the sixth thin film transistor (T6) are in the on state, the third thin film transistor (T3) and the fifth thin film transistor (T5) are in the off state to select the second scan driving circuit to provide the second scan driving signal.

15. The display device according to claim 9, wherein the at least one pixel unit comprises:

a seventh thin film transistor (T7), wherein a source of the seventh thin film transistor is coupled to a data line and a gate of the seventh thin film transistor is coupled to the scanning line;

an eighth thin film transistor (T8), wherein a gate of the eighth thin film transistor is coupled to a drain of the seventh thin film transistor (T7), a source of the eighth thin film transistor is coupled to the high voltage level direct current input end, a drain of the eighth thin film transistor is coupled to an anode of an organic light emitting diode of the at least one pixel unit; a cathode of the organic light emitting diode is grounded;

a ninth thin film transistor (T9), wherein a gate of the ninth thin film transistor is coupled to the scanning line, a source of the ninth thin film transistor is coupled to a detecting circuit and a drain of the ninth thin film transistor is coupled to the drain of the eighth thin film transistor (T8);

a coupling capacitor, wherein a first end of the coupling capacitor is coupled to the gate of the eighth thin film transistor (T8) and a second end of the coupling capacitor is coupled to the drain of the eighth thin film transistor (T8).

16. The display device according to claim 10, wherein the at least one pixel unit comprises:

a seventh thin film transistor (T7), wherein a source of the seventh thin film transistor is coupled to a data line and a gate of the seventh thin film transistor is coupled to the scanning line;

an eighth thin film transistor (T8), wherein a gate of the eighth thin film transistor is coupled to a drain of the seventh thin film transistor (T7), a source of the eighth thin film transistor is coupled to the high voltage level direct current input end, a drain of the eighth thin film transistor is coupled to an anode of an organic light emitting diode of the at least one pixel unit; a cathode of the organic light emitting diode is grounded;

a ninth thin film transistor (T9), wherein a gate of the ninth thin film transistor is coupled to the scanning line, a source of the ninth thin film transistor is coupled to a detecting circuit and a drain of the ninth thin film transistor is coupled to the drain of the eighth thin film transistor (T8);

a coupling capacitor, wherein a first end of the coupling capacitor is coupled to the gate of the eighth thin film transistor (T8) and a second end of the coupling capacitor is coupled to the drain of the eighth thin film transistor (T8).

* * * * *